United States Patent
Liu et al.

(10) Patent No.: US 9,817,055 B2
(45) Date of Patent: Nov. 14, 2017

(54) TESTING APPARATUS FOR TESTING ELECTRICAL CIRCUIT BOARD HAVING ELECTRICAL CONNECTORS THEREON

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Yu-Ching Liu, New Taipei (TW); Po-Lin Su, New Taipei (TW); Fu-Chi Yang, New Taipei (TW); Zhi-Jun Wang, Shenzhen (CN); Shun-Tung Chen, New Taipei (TW); Li-Quan Zhang, Shenzhen (CN); Wei-Da Yang, New Taipei (TW); Jie-Peng Kang, Shenzhen (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 315 days.

(21) Appl. No.: 14/572,398

(22) Filed: Dec. 16, 2014

(65) Prior Publication Data
US 2015/0331037 A1    Nov. 19, 2015

(30) Foreign Application Priority Data

May 19, 2014  (CN) .......................... 2014 1 0212293

(51) Int. Cl.
*G01R 31/04* (2006.01)
*G01R 31/28* (2006.01)
*G01R 1/04* (2006.01)

(52) U.S. Cl.
CPC ......... *G01R 31/043* (2013.01); *G01R 1/0408* (2013.01); *G01R 31/2808* (2013.01)

(58) Field of Classification Search
CPC .......................... G01R 1/0408; G01R 31/2808
See application file for complete search history.

(56) References Cited

U.S. PATENT DOCUMENTS

| | | | | |
|---|---|---|---|---|
| 6,005,404 A | * | 12/1999 | Cochran | G01R 31/2817 324/750.07 |
| 2005/0194989 A1 | * | 9/2005 | Delucco | G01R 31/31924 324/756.05 |

(Continued)

*Primary Examiner* — Jermele M Hollington
*Assistant Examiner* — Feba Pothen
(74) *Attorney, Agent, or Firm* — Steven Reiss

(57) ABSTRACT

A testing apparatus for testing a circuit board is disclosed, which includes an upper plate, a lower plate, and an adaptor circuit board. A plurality of positioning units is received in the lower plate. Each positioning unit has a plurality of length-variable test probes secured therein. Each test probe has a shell and upper and lower probe ends at opposite ends of the shell. In test, the circuit board is put on the lower plate and the upper plate is lowered to push the circuit board and the lower plate toward the adaptor circuit board. The upper ends of the test probes engage with electrical connectors of the circuit board and the lower ends thereof engage with the adaptor circuit board whereby test of the circuit board can be automatically performed by the testing apparatus.

16 Claims, 9 Drawing Sheets

(56) References Cited

U.S. PATENT DOCUMENTS

| | | | |
|---|---|---|---|
| 2013/0127485 A1* | 5/2013 | Mao | G01R 31/2808 324/750.25 |
| 2014/0266274 A1* | 9/2014 | Shiraishi | G01R 1/07357 324/750.25 |
| 2015/0109012 A1* | 4/2015 | Yang | G01R 31/2808 324/750.25 |

* cited by examiner

TESTING APPARATUS FOR TESTING ELECTRICAL CIRCUIT BOARD HAVING ELECTRICAL CONNECTORS THEREON

CROSS-REFERENCE TO RELATED APPLICATION

This application claims priority to Chinese Patent Application No. 201410212293.X filed on May 19, 2014, the contents of which are incorporated by reference herein.

FIELD

The present disclosure relates generally to a testing apparatus for testing an electrical circuit board having electrical connectors thereon, and particularly to a testing apparatus for automatically testing a main circuit board of a mobile phone such as s smart phone which has electrical connectors thereon.

BACKGROUND

Handheld electronic devices, particularly, smart phones are more and more popular since they can promote a great level of convenience for people in every aspect of living, such as communication, work, study, travel, or entertainment. Each component of the handheld electronic device needs testing during manufacturing thereof to ensure its normal function. A main circuit board of the handheld electronic device is an especially important component since it carries a lot of important electronic components thereon such as the central processing unit (CPU) for the handheld electronic device. Performance of the main circuit board enormously affects the performance of the handheld electronic device. Thus, test of the main circuit board is critical.

Nowadays, test of the main circuit board of the handheld device involves manually inserting flexible printed circuit boards of the main circuit board into a testing apparatus, or manually using test probes to engage contacts of the main circuit board or pins of electrical connectors of the flexible circuit boards. Such manual operations are laborious and cannot meet the production requirement of the handheld electronic device which has a steep ram-up after the debut of the device.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
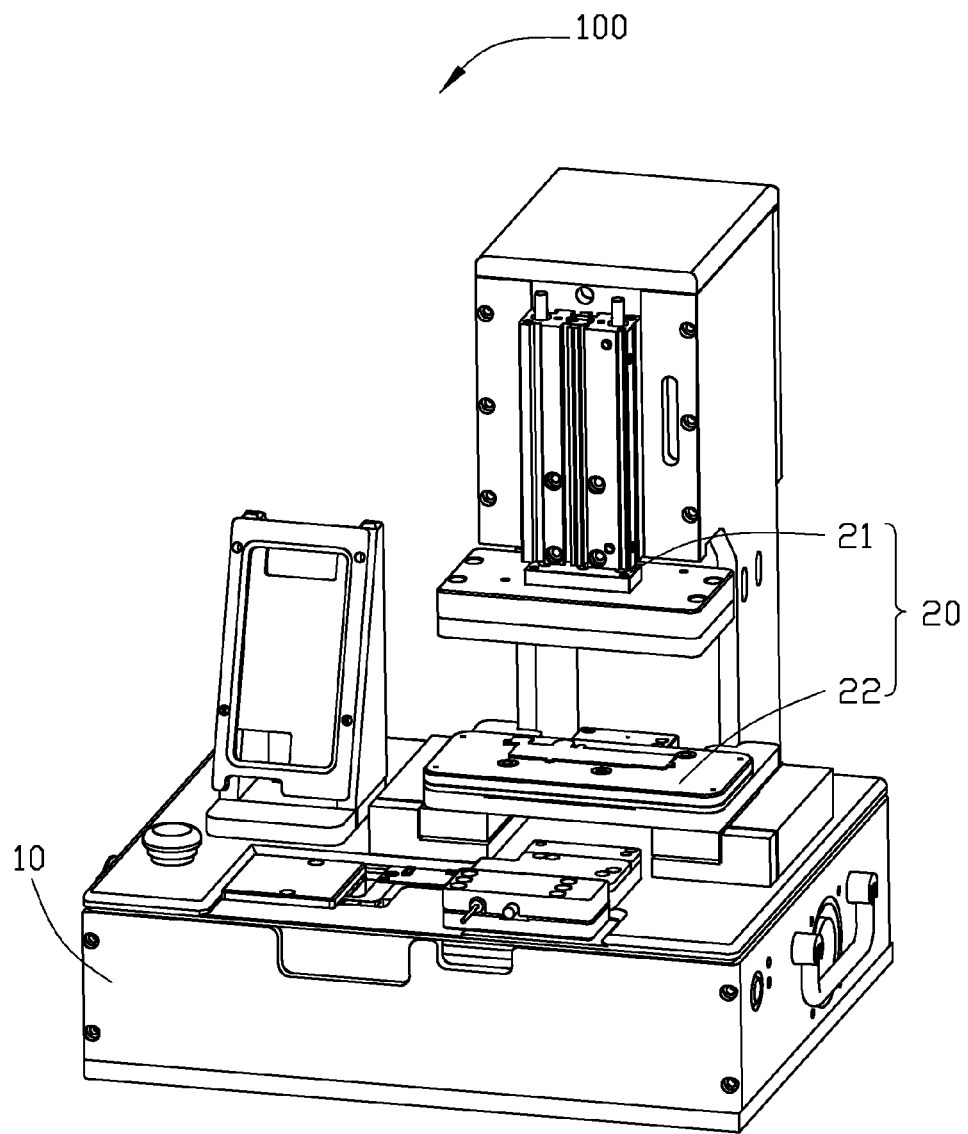
FIG. 1 is an isometric view of a testing apparatus for an electrical circuit board in accordance with the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 5:
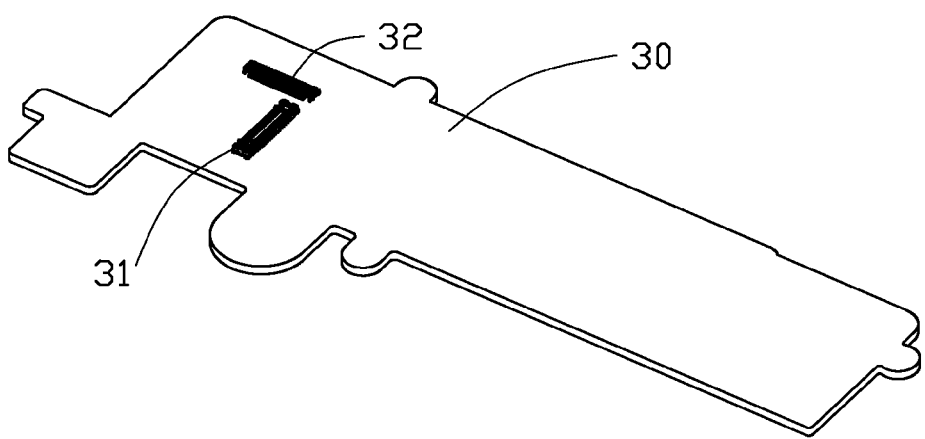
FIG. 5 is an enlarged, isometric view of an electrical circuit board to be tested by the testing apparatus in accordance with the present disclosure.

Referring to FIGS. 1 and 5, a testing apparatus 100 in accordance with the present disclosure is disclosed for testing an electrical circuit board 30. The electrical circuit board 30 preferably is a main circuit board for a mobile phone, particularly a smart phone, and has at least a central processing unit (not shown) and a first electrical connector 31 and a second electrical connector 32 thereon. The testing apparatus 100 has a base 10 and a testing portion 20 on the base 10. The testing portion 20 has a movable part 21 and a fixed part 22.

Figure 2:
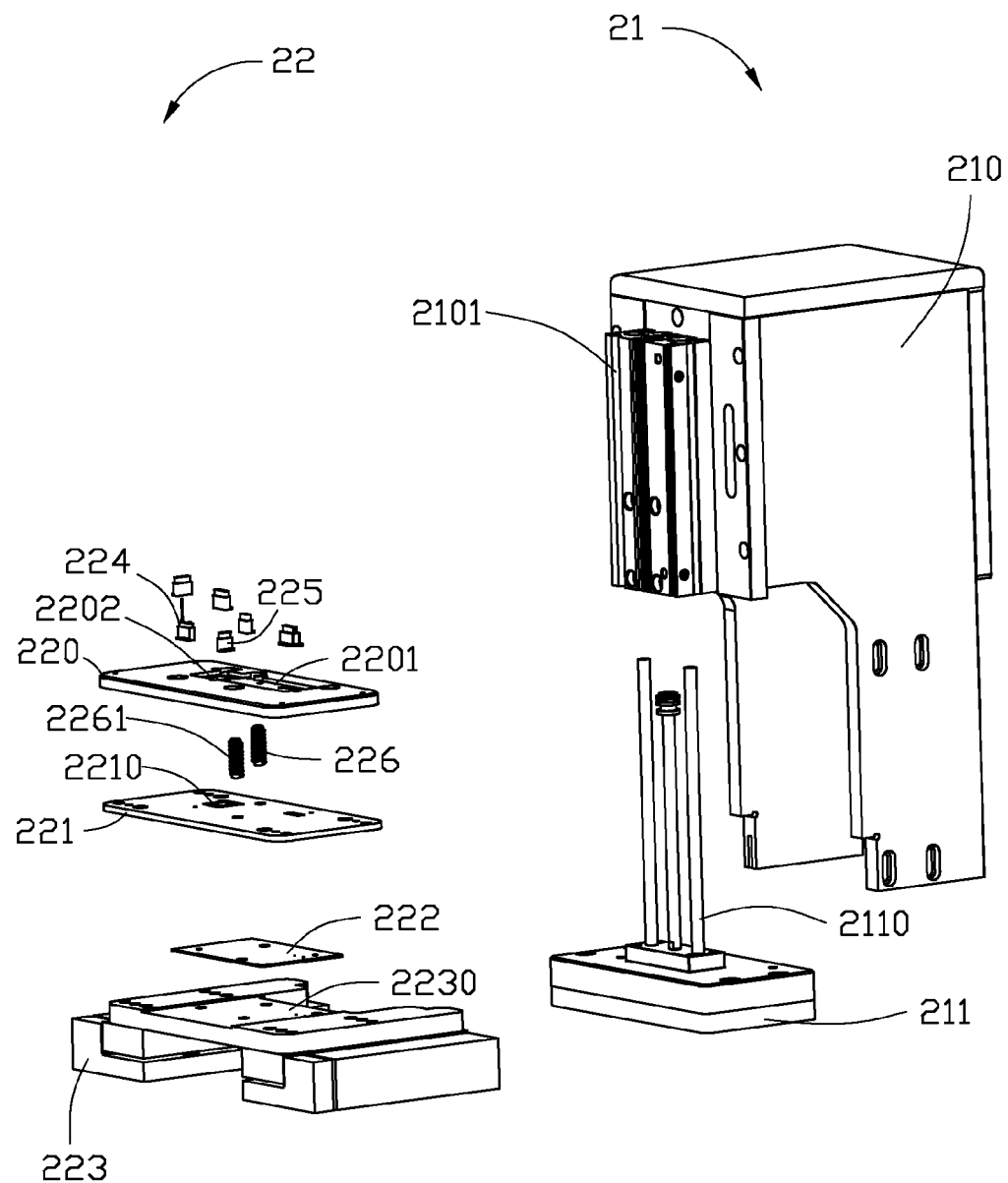
FIG. 2 is an exploded, isometric view of a testing portion of the testing apparatus of FIG. 1.

Also referring to FIG. 2, the movable part 21 has a frame 210 fixed to the base 10 and an upper plate 211 which is vertically movably mounted to the frame 210. In the embodiment, a pneumatic cylinder 2101 is attached to a front face of the frame 210 and a plurality of piston rods 2110 extend upwardly from a top of the upper plate 211 into the pneumatic cylinder 2101 to be slideable therein. By controlling the pneumatic cylinder 2101, the upper plate 211 can move upwardly or downwardly in a controlled manner.

The fixed part 22 consists of a lower plate 220, a fixed plate 221, an adaptor circuit board 222, and a support 223.

The lower plate 220 has a shape and size substantially the same as a shape and size of the upper plate 211. The lower plate 220 defines a first recess 2201, and a plurality of first voids 2202 in the first recess 2201 and through the lower plate 220.

The fixed plate 221 has a shape and size substantially the same as the shape and size of the lower plate 220. The fixed plate 221 defines a plurality of second voids 2210 therethrough. Positions of the second voids 2210 are corresponding to positions of the first voids 2202. The fixed plate 221 and the lower plate 220 are coupled together via a plurality of connecting posts 226. The connecting posts 226 have lower ends firmly secured to the fixed plate 221 and upper ends slideably secured to the lower plate 220. Each connecting post 226 has a compression spring 2261 therearound, whereby the lower plate 220 can move downwardly toward the fixed plate 221 under a downward push of the upper plate 211. In other words, due to the provision of the compression springs 2261 around the connecting posts 226 which interconnect the lower plate 220 and the fixed plate 221, a distance of a gap between the lower plate 220 and the fixed plate 221 becomes variable.

The adaptor circuit board 222 is received in the support 223. The adaptor circuit board 222 is electrically coupled with the testing apparatus 100, whereby electrical signals can be transmitted to/from the adaptor circuit board 222 from/to the testing apparatus 100. The support 223 defines a second recess 2230 which has a shape and a size substantially the same as a shape and a size of the adaptor circuit board 222. The adaptor circuit board 222 is securely received in the second recess 2230 by a plurality screws (not shown) extending through the adaptor circuit board 222 into the support 223.

Figure 3:
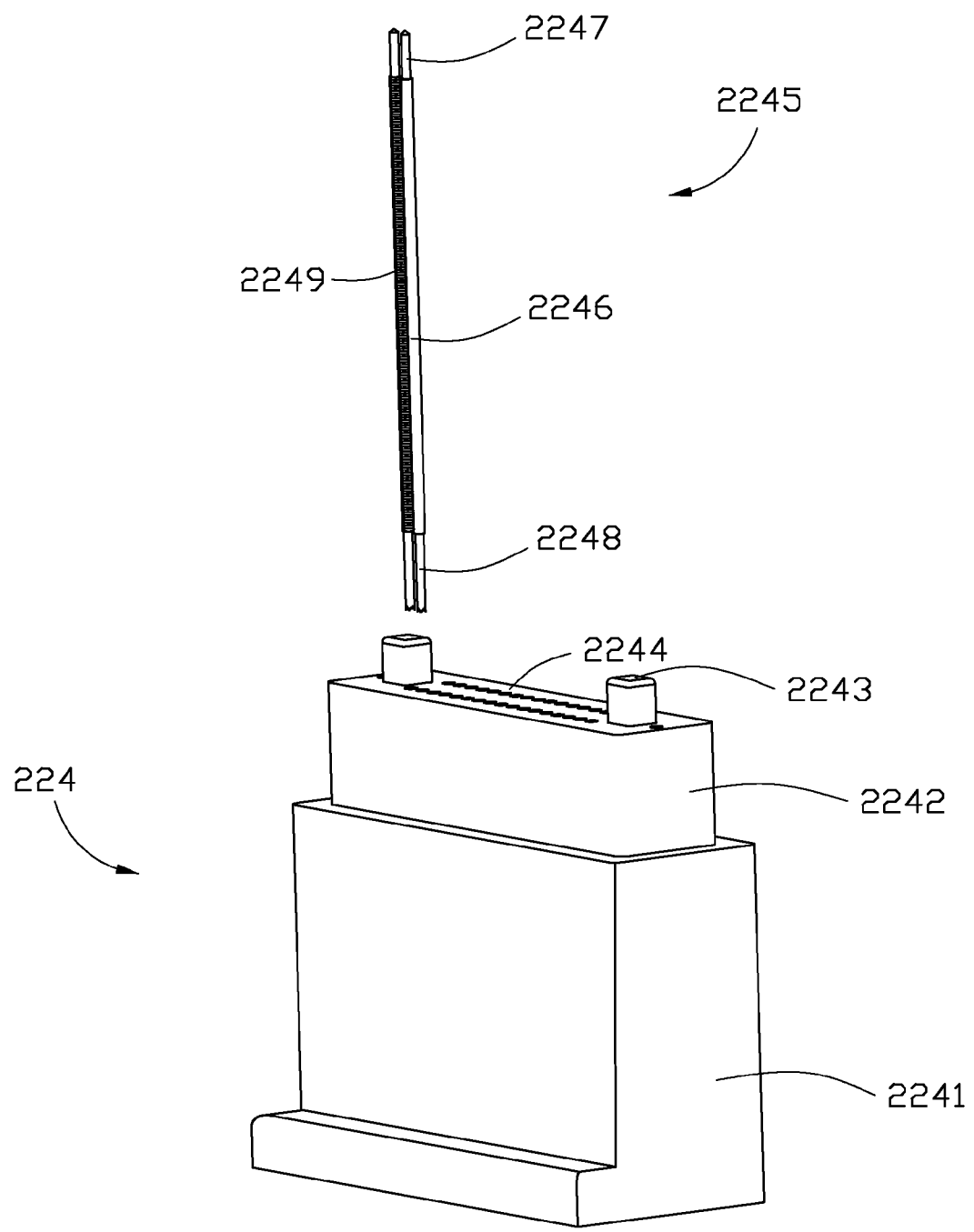
FIG. 3 is an enlarged, isometric view of a first positioning unit of the testing portion of FIG. 2.
Figure 4:
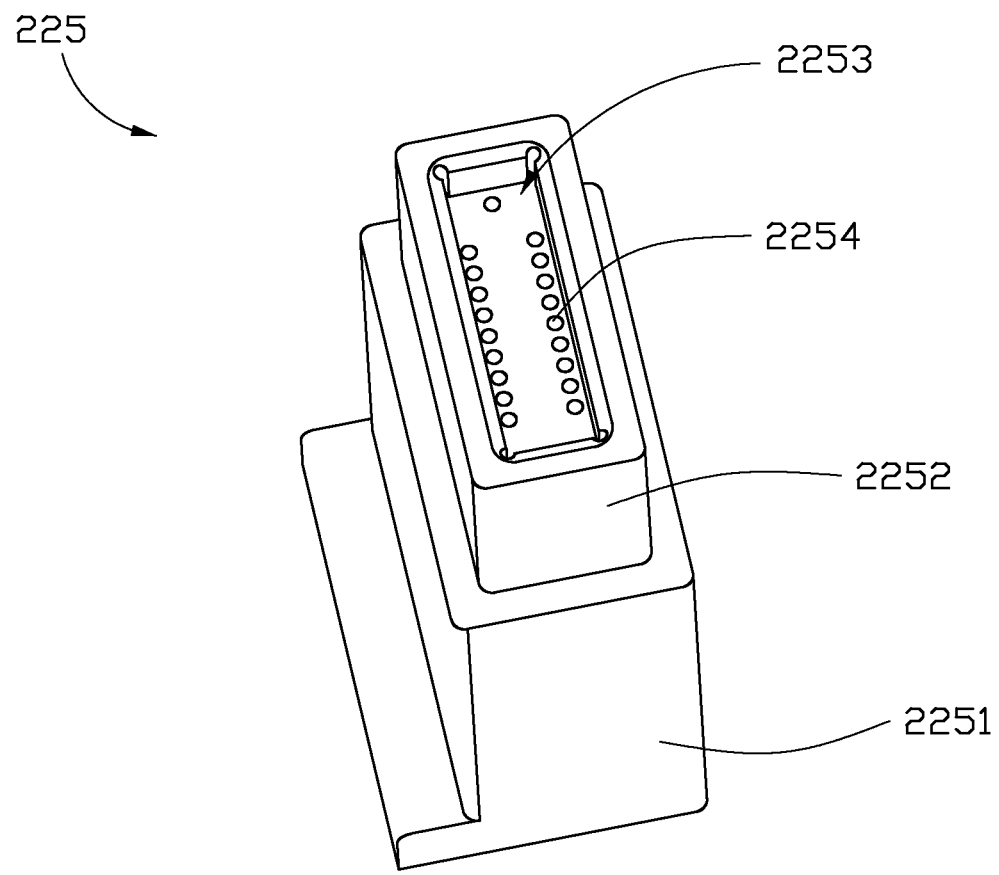
FIG. 4 is an enlarged, isometric view of a second positioning unit of the testing portion of FIG. 2.

Referring to FIGS. 3 and 4, the fixed part 22 further includes a plurality of first positioning units 224 and second positioning units 225. The first and second positing units 224, 225 in total have a number which is the same as a number of the first voids 2202 and accordingly a number of the second voids 2210. Each of the first and second positioning units 224, 225 has a lower end firmly fixed in a corresponding second void 2210 of the fixed plate 221 and an upper end slideably extending upwardly through a corresponding first void 2202 of the lower plate 220 and received in the first recess 2201 thereof.

The first positioning unit 224 includes a first body 2241 and a first protrusion 2242 protruding upwardly from a top end of the first body 2241. The first protrusion 2242 forms two positioning studs 2243 on a top thereof, away from the first body 2241. A plurality of first through holes 2244 are defined through the first protrusion 2242 and the first body 2241. In the embodiment, the positioning studs 2243 are formed at two lateral sides of the top of the first protrusion 2242, and the first through holes 2244 are defined between the two positioning studs 2243.

The first positioning unit 224 further includes a plurality of test probes 2245 (only two shown in FIG. 3) whose number is the same as the number of the first through holes 2244. Each test probe 2245 is mounted in a corresponding first through hole 2244. Each test probe 2245 includes a shell 2246 and a first, upper probe end 2247 and a second, lower probe end 2248 mounted at two opposite ends of the shell 2246. The shell 2246 is made of electrically insulating material such as plastic, while the first and second probe ends 2247, 2248 are made of electrically conductive material such as metal and preferably copper. A helical spring 2249 made of metal is received in the shell 2246 and interconnects the first, upper probe end 2247 and the second, lower probe end 2248, whereby the first, upper and second, lower probe ends 2247, 2248 are electrically connected together and can be retracted inwardly toward each other when they are subjected to a pushing force thereon. In FIG. 3, only one helical spring 2249 is shown; however, it can be understood that each test probe 2245 has a helical spring 2249 therein.

The second positioning unit 225 has a second body 2251 and a second protrusion 2252 protruding upwardly from a top of the second body 2251. The second protrusion 2252 defines a positioning cavity 2253 in a top thereof, away from the second body 2251. A plurality of second through holes 2254 are defined in the second body 2251 and the second protrusion 2252 of the second positioning unit 225 and exposed upwardly from a bottom of the positioning cavity 2253. It can be understood that each second through hole 2254 is also mounted with a test probe 2245 therein, although there is no test probe shown in FIG. 4.

Figure 6:
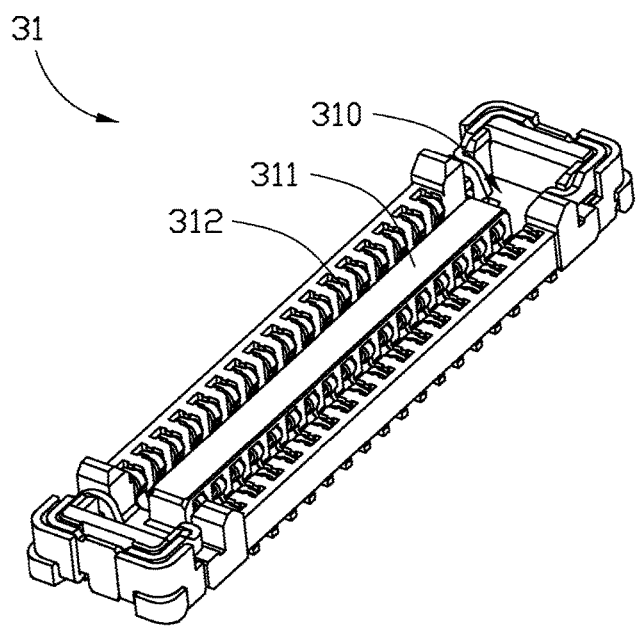
FIG. 6 is an enlarged, isometric view of a first electrical connector of the electrical circuit board of FIG. 5
Figure 7:
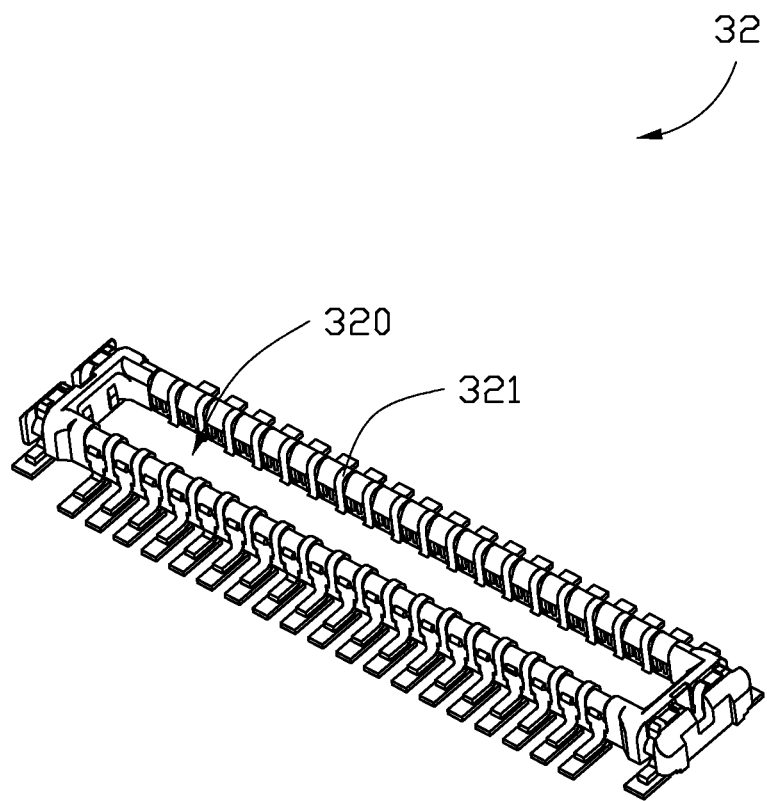
FIG. 7 is an enlarged, isometric view of a second electrical connector of the electrical circuit board of FIG. 5.

Referring also to FIGS. 5-7, the electrical circuit board 30 to be tested has a shape and size substantially the same as the shape and size of the first recess 2201 of the lower plate 220. The first and second electrical connectors 31, 32 are electrically and mechanically mounted on the electrical circuit board 30. Particularly referring to FIG. 6, the first electrical connector 31 defines a third recess 310 in a top thereof. The first electrical connector 31 forms a third protrusion 311 in the third recess 310. Furthermore, the first electrical connector 31 has a plurality of first contact pins 312 secured therein. Each first contact pin 312 has an outer end soldered to the electrical circuit board 30 and an inner end located in the third recess 310.

Particularly referring to FIG. 7, the second electrical connector 32 defines a fourth recess 320 in a top thereof. A plurality of second contact pins 321 are secured in the second electrical connector 32. Each second contact pin 321 has an outer end electrically and mechanically mounted on the electrical circuit board 30 and an inner end secured to an inside of a wall of a housing of the second electrical connector 32 defining the fourth recess 320.

Figure 8:
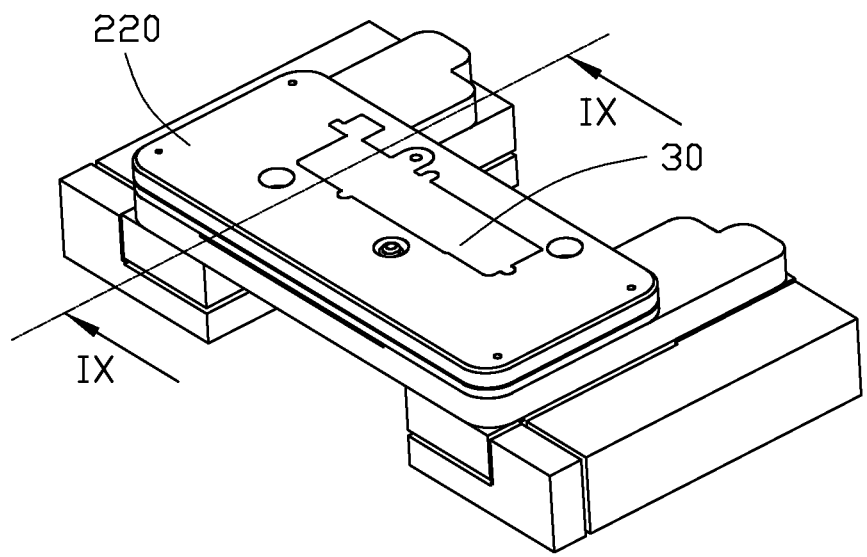
FIG. 8 is an isometric view showing an assembly of the electrical circuit board of FIG. 5 and the testing portion of FIG. 2.
Figure 9:
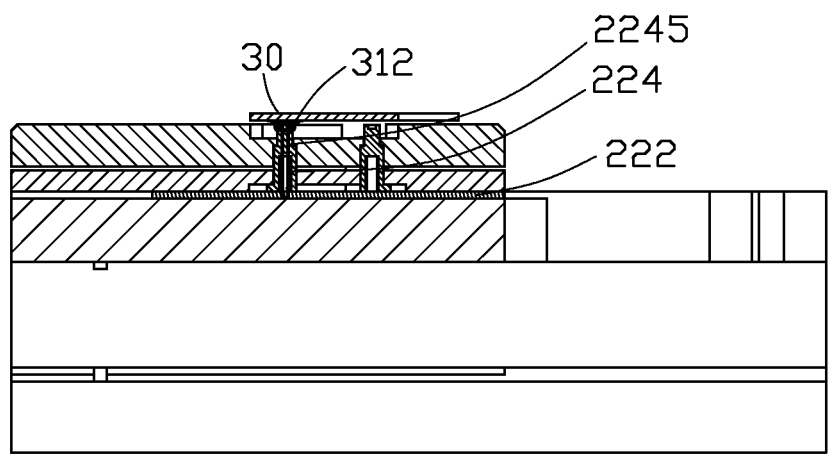
FIG. 9 is a cross-sectional view of FIG. 8 taken along line IX-IX thereof.

Now please refer to FIGS. 8 and 9. To perform the test of the electrical circuit board 30, first, the electrical circuit board 30 is brought to be mounted in the first recess 2201 of the lower plate 220. Then the upper plate 211 is activated by a driving of the pneumatic cylinder 2101 to move downwardly toward the lower plate 220. The lower plate 220 together with the electrical circuit board 30 is pressed downwardly by the upper plate 211 to move downwards, whereby the lower plate 220, the electrically circuit board 30 and the fixed plate 221 together are moved downward toward the adaptor circuit board 222 until the fixed plate 221 engages with the adaptor circuit board 222 with the compression springs 2261 and the helical springs 2249 being compressed. At this moment the second, lower probe ends 2248 of the test probes 2245 are electrically engaged with the adaptor circuit board 222 and the first, upper probe ends 2247 of the test probes 2245 which are received in the first recess 2201 of the lower plate 220 are electrically engaged with the first contact pins 312 of the first electrical connector 31 and the second contact pins 321 of the second electrical connector 32 whereby electrical signals can be sent to the first and second electrical connectors 31, 32 from the adaptor circuit board 222 to test the performance of the first and second electrical connectors 31, 32 and the electrical circuit board 30.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A testing apparatus for testing an electrical circuit board having at least one electrical connector thereon, comprising:
an adaptor circuit board configured to transmit electrical signals between the testing apparatus and the electrical circuit board;
a lower plate defining a plurality of voids therethrough;
a plurality of positioning units each having at least one test probe fixed therein received in a corresponding void of the lower plate, wherein the at least one test probe comprises an electrically insulating shell; a first probe end and a second probe end respectively located at two opposite ends of the electrically insulating shell, and a resilient member received in the electrically insulating shell and interconnecting the first and second probe ends, the first and second probe ends being retractable into the electrically insulating shell when subjected to a pushing force, and wherein the first and second probe ends and the resilient member are made of electrically conductive materials;
a fixed plate located between the adaptor circuit board and the lower plate, the fixed plate being connected to the lower plate with a gap therebetween, a distance of the gap being variable, lower ends of the plurality of positioning units being firmly secured to the fixed plate; and
an upper plate vertically movable relative to the lower plate;
wherein when the electrical circuit board is mounted on the lower plate, the upper plate moves downwardly to press the electrical circuit board and the lower plate toward the adaptor circuit board to cause the at least one test probe to electrically engage the adaptor circuit board and the at least one electrical connector.

2. The testing apparatus of claim 1, wherein the resilient member is a helical spring made of metal.

3. The testing apparatus of claim 2, wherein the first and second probe ends are made of metal.

4. The testing apparatus of claim 1, wherein the lower plate defines a recess in a side thereof facing the upper plate, the recess being configured to receive the electrical circuit board therein when the electrical circuit board is tested by the testing apparatus.

5. The testing apparatus of claim 1, further comprising a frame and a pneumatic cylinder having at least one vertically movable piston rod, the upper plate being secured to the at least one vertically movable piston rod and movable therewith by a driving of the pneumatic cylinder.

6. The testing apparatus of claim 1, wherein the fixed plate and the lower plate are connected together by at least one connecting post which has a resilient member surrounding therearound.

7. The testing apparatus of claim 6, wherein when the lower plate and the electrical circuit board are pressed by the upper plate to test the electrical circuit board, the fixed plate engages with the adaptor circuit board.

8. The testing apparatus of claim 7, further comprising a support defining a second recess facing the fixed plate, the adaptor circuit board being received in the second recess.

9. The testing apparatus of claim 1, wherein each of the positioning units comprises a body, a protrusion protruding from a face of the body toward the upper plate, two positioning studs extending from a face of the protrusion toward the upper plate, and a plurality of through holes being defined through the body and the protrusion and located between the two positioning studs, the at least one probe comprising a plurality of test probes and each through hole receiving one of the test probes therein.

10. The testing apparatus of claim 1, wherein each of the positioning units comprises a body, a protrusion protruding from a face of the body toward the upper plate, a positioning cavity defined in a face of the protrusion facing the upper plate, and a plurality of through holes being defined through the body and the protrusion and having top ends exposed to the positioning cavity, the at least one probe comprising a plurality of test probes and each through hole receiving one of the test probes therein.

11. A testing apparatus, comprising:
a frame having an activating device mounted thereon;
an upper plate driveably connected to the activating device whereby the upper plate is movable upwardly and downwardly;
a lower plate defining a recess in a top thereof, the lower plate further having a plurality of first positioning units and a plurality of second positioning units mounted therein, wherein each of the first and second positioning units has at least one length-variable test probe mounted therein, the length-variable test probe comprising a shell secured in each of the first and second positioning units, an upper probe end located at a top end of the shell, a lower probe end located at a bottom end of the shell and a spring located in the shell and interconnecting the upper and lower probe ends, the upper probe ends of the test probes being received in the recess; and
an adaptor circuit board located below the lower plate;
wherein when an electrical circuit board to be tested is received in the recess, the upper plate is lowered by a driving of the activating device to press the electrical circuit board and the lower plate toward the adaptor circuit board, the length-variable test probes of the first positioning units electrically engage with a first electrical connector of the electrical circuit board and the adaptor circuit board, and the length-variable test probes of the second positioning units electrically engage with a second electrical connector of the electrical circuit board and the adaptor circuit board.

12. The testing apparatus of claim 11, wherein each of the first positioning units comprises a first body, a first protrusion protruding upwardly from a top of the first body, two positioning studs extending upwardly from a top of the first protrusion and a plurality of first through holes extending through the first body and the first protrusion and located between the two positioning studs, the at least one length-variable test probe in each of the first positioning units comprising a plurality of length-variable test probes each being received in a corresponding first through hole.

13. The testing apparatus of claim 12, wherein each of the second positioning units comprises a second body, a second protrusion protruding upwardly from a top of the second body, a positioning cavity defined in a top of the first protrusion, and a plurality of the second through holes extending through the second body and the second protrusion with top ends of the second through holes being exposed to the positioning cavity, the at least one length-variable test probe in each of the second positioning units comprising a plurality of length-variable test probes each being received in a corresponding second through hole.

14. The testing apparatus of claim 13, further comprising a fixed plate located between the adaptor circuit board and the lower plate, the fixed plate being connected to the lower plate with a gap therebetween, a distance of the gap being variable, lower ends of the first and second positioning units being firmly secured to the fixed plate, upper ends of the first and second positioning units being slideably received in the lower plate.

15. The testing apparatus of claim 14, wherein the fixed plate and the lower plate are connected together by at least one connecting post which has a resilient member surrounding therearound.

16. The testing apparatus of claim 15, wherein when the lower plate and the electrical circuit board are pressed by the upper plate to test the electrical circuit board, the fixed plate engages with the adaptor circuit board.

* * * * *